United States Patent
Liaw

(10) Patent No.: US 8,717,798 B2
(45) Date of Patent: May 6, 2014

(54) LAYOUT FOR SEMICONDUCTOR MEMORIES

(75) Inventor: Jhon Jhy Liaw, Zhudong Township, Hsinchu County (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 230 days.

(21) Appl. No.: 13/242,399

(22) Filed: Sep. 23, 2011

(65) Prior Publication Data

US 2013/0077375 A1   Mar. 28, 2013

(51) Int. Cl.
*G11C 5/06* (2006.01)

(52) U.S. Cl.
USPC ............... 365/72; 365/63; 365/154; 365/163

(58) Field of Classification Search
USPC ............ 365/72, 104, 63, 154, 202, 149, 200, 365/163, 148, 230.03, 230.06, 230.01, 226
See application file for complete search history.

(56) References Cited

U.S. PATENT DOCUMENTS

| 7,405,994 | B2 | 7/2008 | Liaw | |
| 7,706,172 | B2* | 4/2010 | Mayor et al. | 365/154 |
| 8,537,597 | B2* | 9/2013 | Kushida | 365/148 |
| 2005/0213359 | A1* | 9/2005 | Kim | 365/49 |
| 2005/0247981 | A1* | 11/2005 | Wang | 257/369 |
| 2006/0131614 | A1* | 6/2006 | Liaw | 257/222 |
| 2006/0291274 | A1* | 12/2006 | Uematsu | 365/154 |
| 2008/0031029 | A1* | 2/2008 | Liaw | 365/63 |
| 2009/0091970 | A1* | 4/2009 | Nii | 365/154 |
| 2011/0026289 | A1 | 2/2011 | Liaw | |
| 2011/0026308 | A1 | 2/2011 | Liaw | |

* cited by examiner

*Primary Examiner* — Toan Le
(74) *Attorney, Agent, or Firm* — Duane Morris LLP

(57) ABSTRACT

A semiconductor memory includes a first conductive layer including a first pair of bit lines coupled to a first bit cell and a second conductive layer including a second pair of bit lines coupled to the first bit cell. The first and second conductive layers are vertically separated from each other.

13 Claims, 9 Drawing Sheets

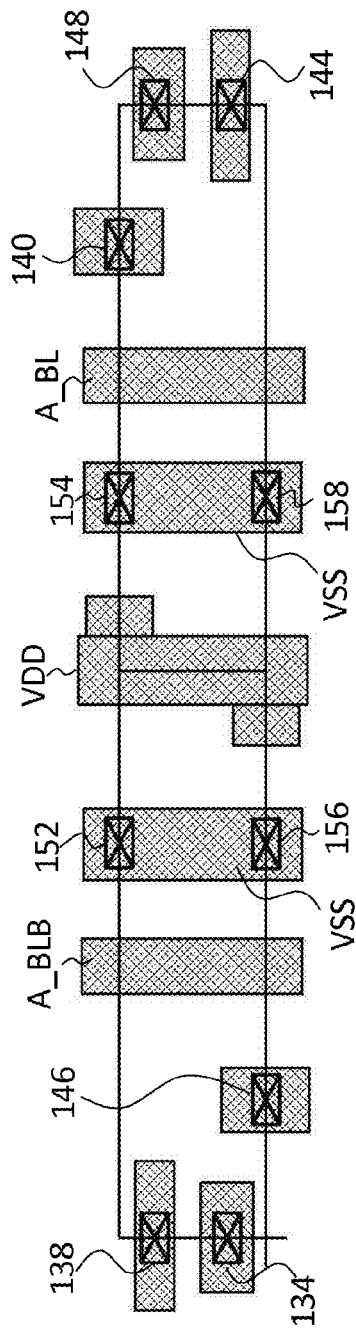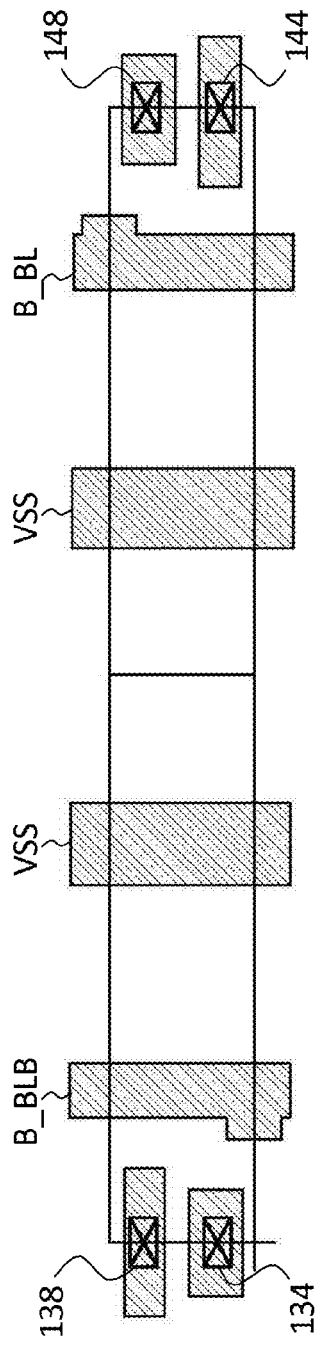
FIG. 4A
FIG. 4B

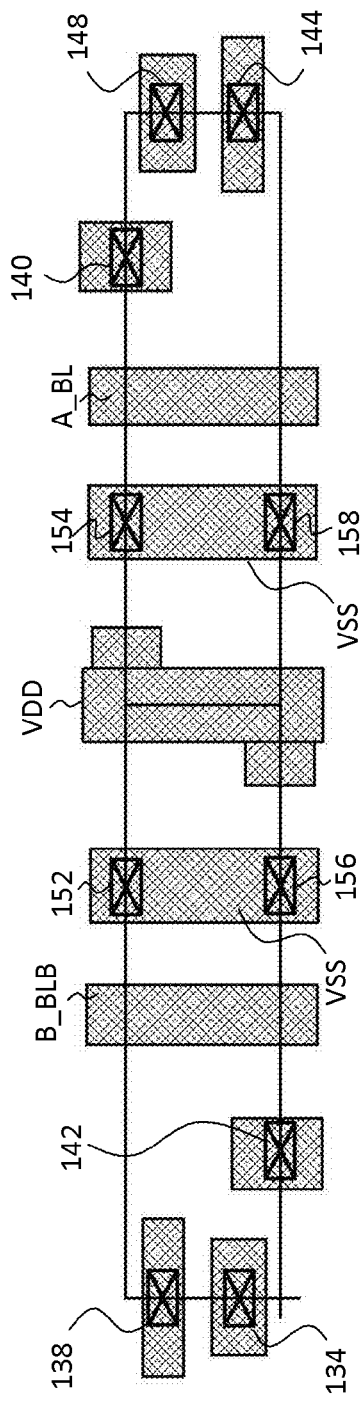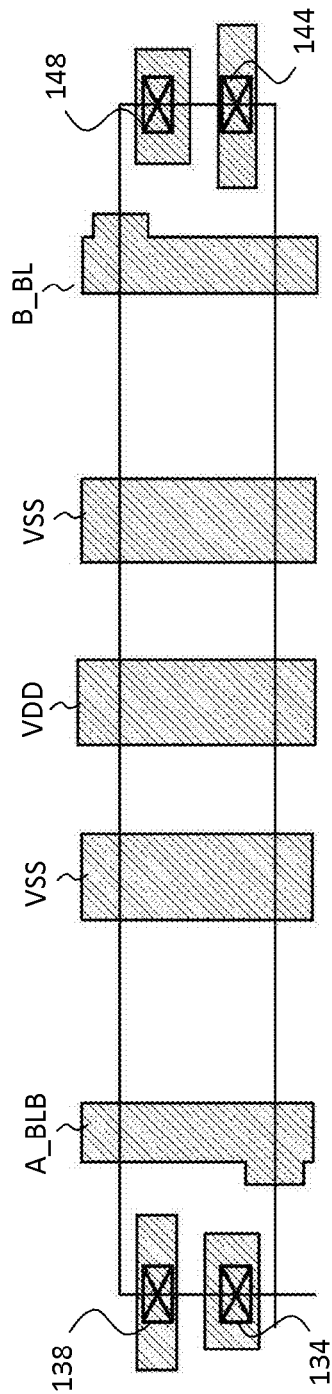
FIG. 5A
FIG. 5B

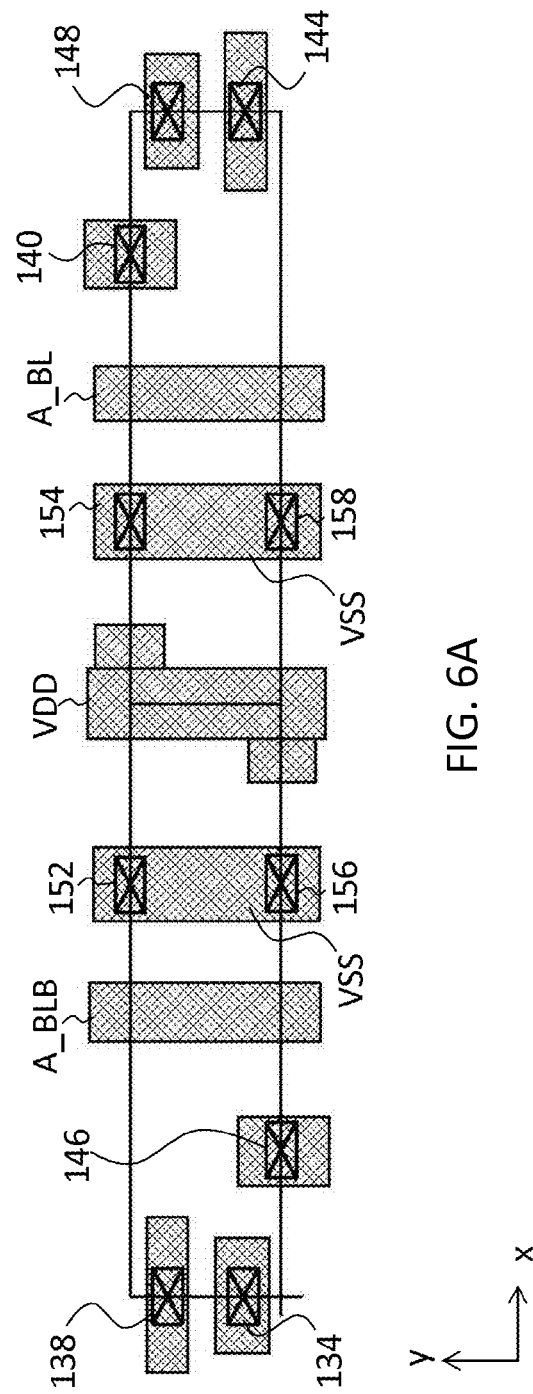
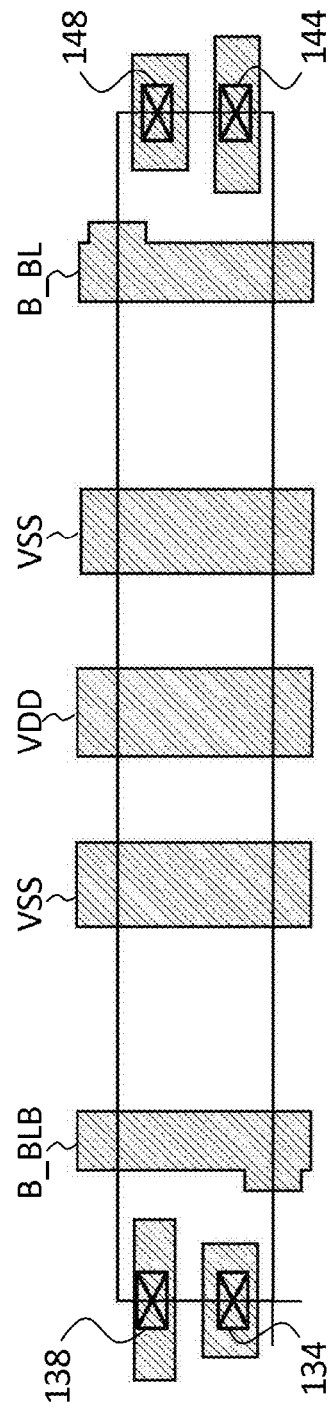
FIG. 6A
FIG. 6B

LAYOUT FOR SEMICONDUCTOR MEMORIES

FIELD OF DISCLOSURE

The disclosed system and method relate to semiconductor memories. More specifically, the disclosed system and method relate to layouts for semiconductor memories.

BACKGROUND

Static random access memories ("SRAM") include a plurality of cells disposed in rows and columns to form an array. SRAM cells include a plurality of transistors coupled to bit lines and word lines that are used to read and write a bit of data to the memory cell. Dual port SRAMs are a specific type of SRAM that enables multiple reads or writes to occur at approximately the same time. Conventional dual port SRAM structures includes multiple bit lines and voltage supply lines (VSS and VDD) in a single conductive layer, which requires a large footprint to adequately space these lines from each other to avoid resistive and capacitive ("RC") coupling issues.

BRIEF DESCRIPTION OF THE DRAWINGS

FIG. 4A illustrates another example of a layout of a second conductive layer of a semiconductor bit cell in accordance with FIG. 2.

FIG. 4B illustrates another example of a layout of a third conductive layer of a semiconductor bit cell in accordance with FIG. 2.

FIG. 5A illustrates another example of a layout of a second conductive layer of a semiconductor bit cell in accordance with FIG. 2.

FIG. 5B illustrates another example of a layout of a third conductive layer of a semiconductor bit cell in accordance with FIG. 2.

FIG. 6A illustrates another example of a layout of a second conductive layer of a semiconductor bit cell in accordance with FIG. 2.

FIG. 6B illustrates another example of a layout of a third conductive layer of a semiconductor bit cell in accordance with FIG. 2.

DETAILED DESCRIPTION

Some embodiments of the disclosed layout advantageously provide for a symmetric resistance and capacitive ("RC") loading across the word lines ("WL") of a semiconductor memory. The symmetric loading enables semiconductor memory to operate at a faster speed than conventional semiconductor memories with uneven RC loading.

Figure 1:
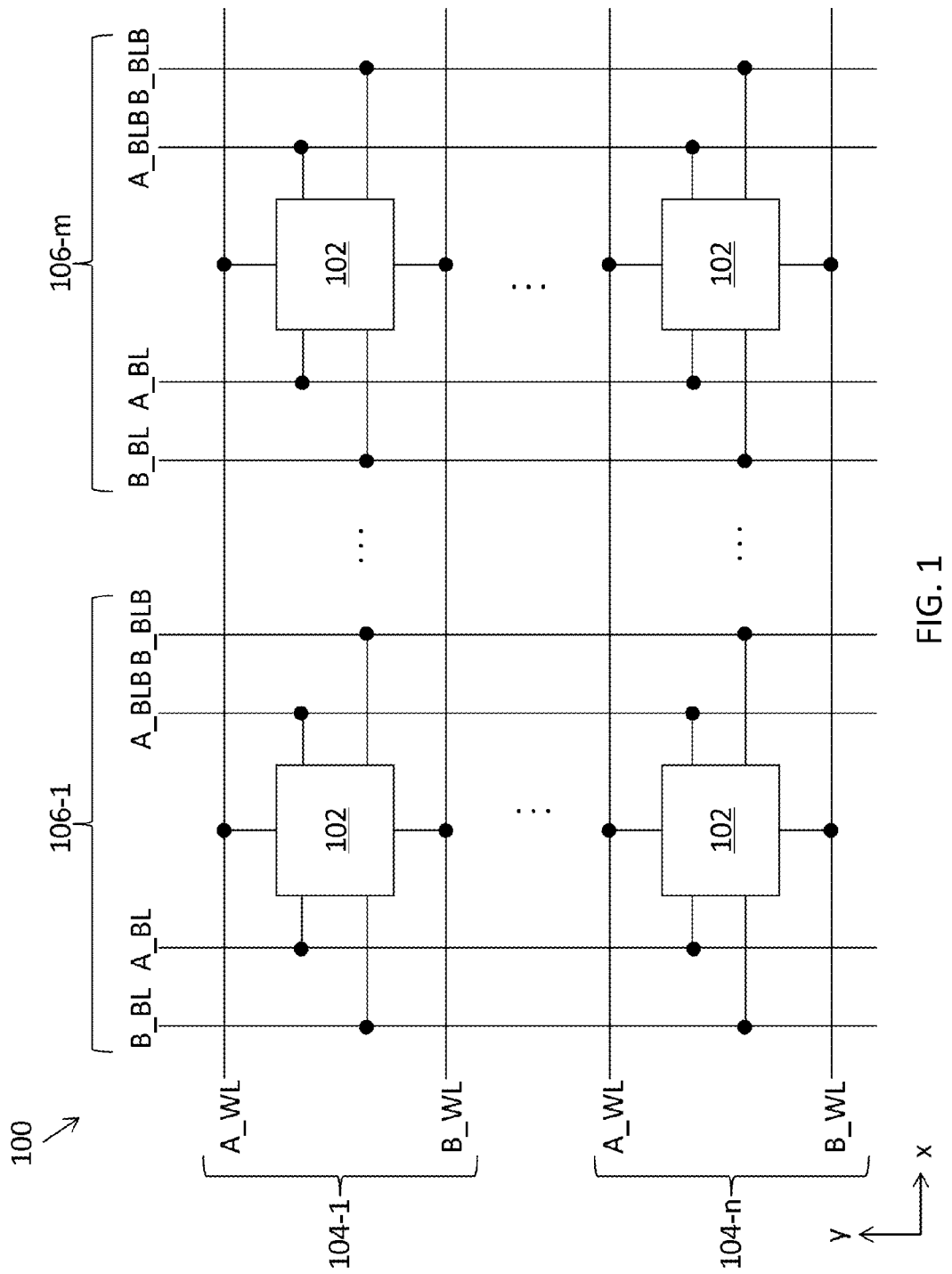
FIG. 1 illustrates one example of a semiconductor memory comprising a plurality of bit cells arranged in rows and columns.

FIG. 1 illustrates one example of a dual port static random access memory ("SRAM") array 100 including a plurality of bit cells 102. Bit cells 102 are arranged in a number, n, of rows 104 and a number, m, of columns 106. Each bit cell 102 is disposed between a pair of word lines, A_WL and B_WL, that extend horizontally across the memory array (i.e., in an x-direction) and two complementary bit lines ("BL"), A_BL and its complement A_BLB and B_BL and its complement B_BLB, that extend vertically across the memory array (i.e., in a y-direction).

Figure 2:
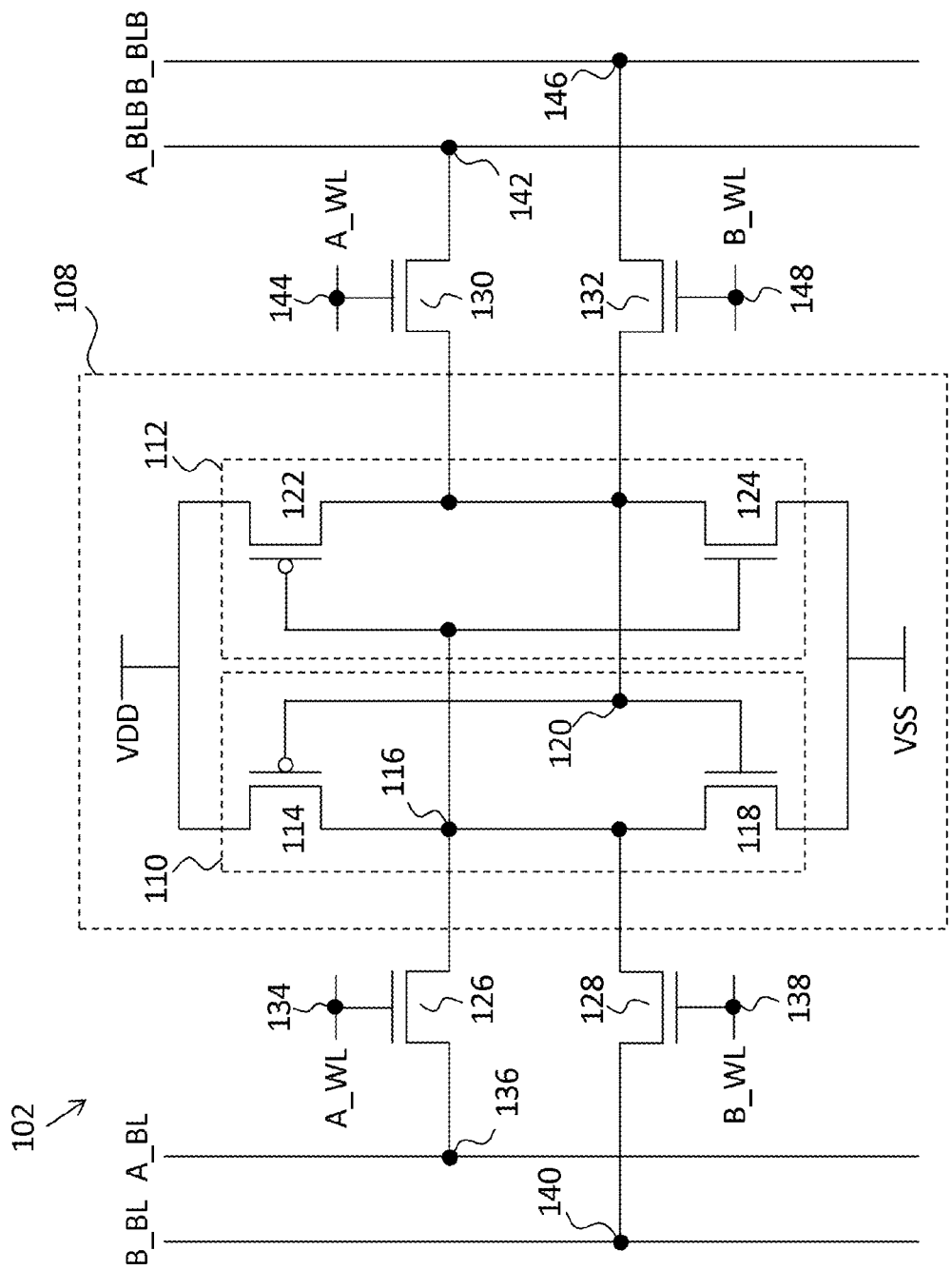
FIG. 2 illustrates one example of an eight transistor memory bit cell that may be implemented in the semiconductor memory of FIG. 1.

As best seen in FIG. 2, which is one example of an eight transistor ("8T") bit cell, each bit cell includes a latch 108 formed by a pair of cross coupled inverters 110, 112. Although an 8T bit cell is illustrated, one skilled in the art will understand that bit cell 102 may include other numbers of transistors including, but not limited to, 6T, 10T, 12T, and 14T, to name a few possibilities. Inverter 110 includes a PMOS transistor 114 having its source coupled to high-voltage source, VDD, and its drain coupled to node 116, which serves as the output of inverter 110. NMOS transistor 118 of inverter 110 has its source coupled to low-voltage source VSS and its drain coupled to node 116. The gates of transistors 114 and 118 are coupled together at node 120, which serves as the input of inverter 110 and the output of inverter 112. Inverter 112 includes a PMOS transistor 122 having is source coupled to VDD, its gate coupled to node 116, and its drain coupled to node 120. NMOS transistor 124 of inverter 112 has its source coupled to VSS, its drain coupled to node 120, and its gate coupled to node 116.

Bit cell 102 also includes a plurality of pass transistors 126, 128, 130, and 132. In some embodiments, transistors 126, 128, 130, and 132 are NMOS transistors, although one skilled in the art will understand that transistors 126, 128, 130, and 132 may be implemented as PMOS transistors. Transistor 126 has its gate coupled to word line A_WL at node 134, its source coupled to node 116, and its drain coupled to bit line A_BL at node 136. Transistor 128 has its gate coupled to word line B_WL at node 138, its source coupled to node 116, and its drain coupled to bit line B_BL at node 140. Transistor 130 has its source coupled to node 120, its drain coupled to bit line A_BLB at node 142, and its gate coupled to word line A_WL at node 144. Transistor 132 has its source coupled node 120, its drain coupled to bit line B_BLB at node 146, and its gate coupled to word line B_WL at node 148.

The transistors of bit cell 102 may be formed in one or more active regions of a semiconductor substrate using various technologies. For example, the transistors of the bit cell may be formed as bulk planar metal oxide field effect transistors ("MOSFETs"), bulk finFETs having one or more fins or fingers, semiconductor on insulator ("SOI") planar MOSFETs, SOI finFETs having one or more fins or fingers, or combinations thereof. The gates of the devices may include a polysilicon ("poly")/silicon oxynitride ("SiON") structure, a high-k/metal gate structure, or combinations thereof. Examples of the semiconductor substrate include, but are not limited to, bulk silicon, silicon-phosphorus ("SiP"), silicon-germanium ("SiGe"), silicon-carbide ("SiC"), germanium ("Ge"), silicon-on-insulator silicon ("SOI—Si"), silicon-on-insulator germanium ("SOI—Ge"), or combinations thereof. The improved layouts disclosed herein advantageously reduces the footprint of the memory bit cells, which enables an increased density and faster operating times by shortening the interconnects. In some embodiments, the layouts have a length-to-width ratio of greater than or equal to three. In some embodiments, the layouts have a length-to-width ratio of greater than 3.5; however, one skilled in the art will understandt hat the bit cell layouts may have other length-to-width ratios.

Figure 3A:
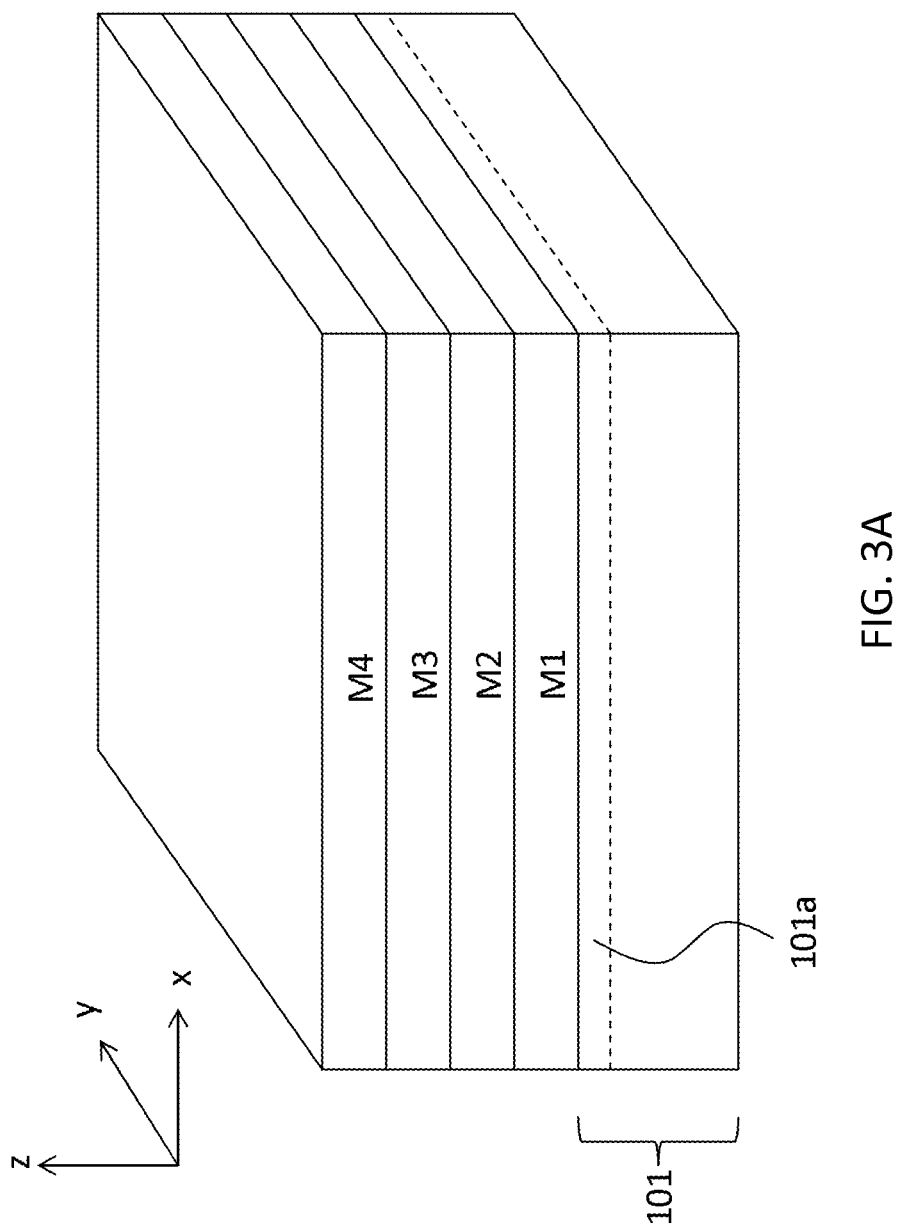
FIG. 3A is an isometric view of one example of a semiconductor substrate over which a plurality of conductive layers are formed to provide a semiconductor memory in accordance with FIGS. 1 and 2.

One example of an improved layout of a bit cell 102 is illustrated in FIGS. 3A-3E. FIG. 3A is an isometric view of a semiconductor substrate 101 having one or more doped active regions 101a. For example, one or more n-wells and/or p-wells may be formed in doped regions 101a. A plurality of conductive layers, M1-M4 are formed above substrate 101 in a vertical or z-direction. Each conductive layer M1-M4 defines a plane in the x- and y-direction and may be separated from each other and from substrate 101 by one or more dielectric layers (not shown). As will be understood by one skilled in the art, vias extend in the vertical direction, i.e., z-direction, to provide interconnects between conductive layers M1-M4 and semiconductor substrate 101. Fewer or more than four metal layers may be formed over semiconductor substrate 101.

Figure 3B:
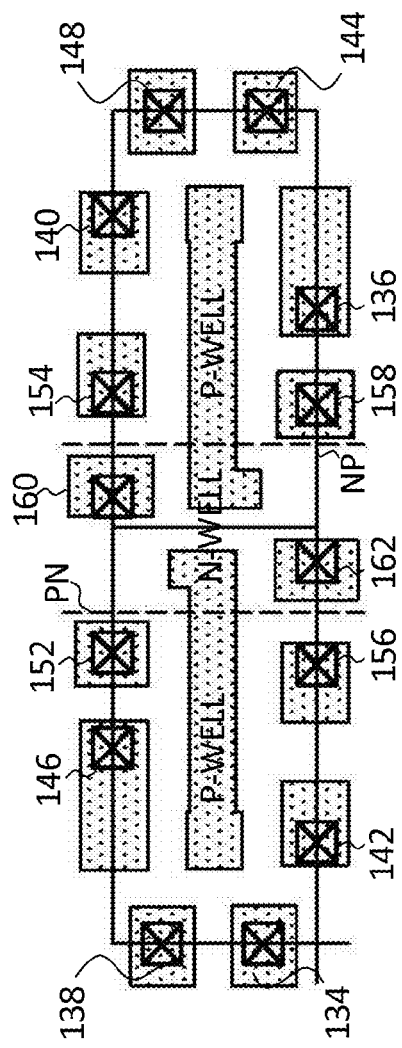
FIG. 3B illustrates one example of a layout of a first conductive layer of a semiconductor bit cell in accordance with FIG. 2.

Turning now to FIG. 3B, which may be the layout of a first conductive layer, e.g., layer M1, of bit cell 102, a plurality of vias are disposed around the periphery of bit cell 102 for coupling various lines to the devices of the bit cell 102. For example, vias 138 and 148 respectively couple the gates of transistors 128 and 132 formed in semiconductor substrate 101 (not shown in FIG. 3B) to word line B_WL, and vias 134 and 144 respectively couple the gates of transistors 126 and 130 formed in semiconductor substrate 101 (not shown in FIG. 3B) to word line A_WL. Via 146 connects the drain of transistor 132 formed in semiconductor substrate 101 (not shown in FIG. 3B) to bit line B_BLB, which extends in a y-direction in a second conductive layer as illustrated in FIG. 3B.

Figure 3C:
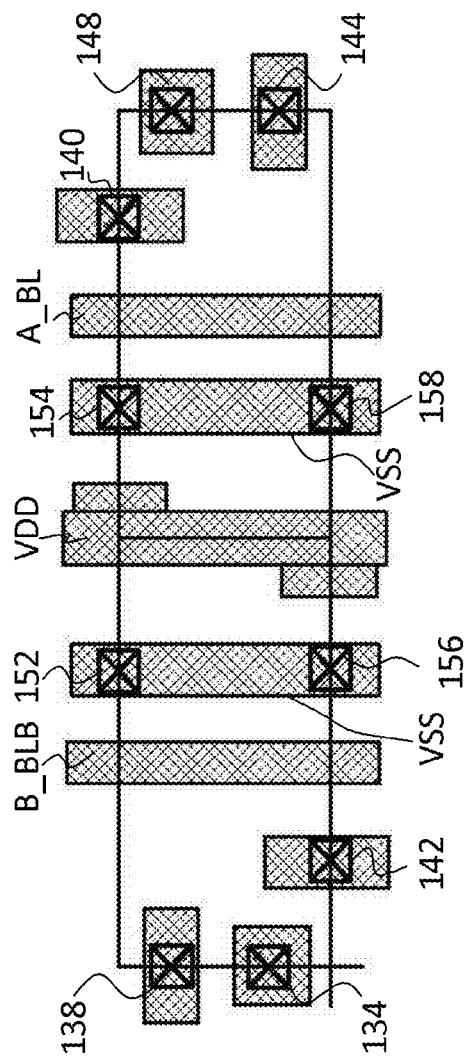
FIG. 3C illustrates one example of a layout of a second conductive layer of a semiconductor bit cell in accordance with FIG. 2.

Vias 160 and 162 connect the sources of transistors 114 and 122, which are disposed in the semiconductor substrate 101 (not shown in FIG. 3B) to power supply VDD that extends in the y-direction in the conductive layer illustrated in FIG. 3C. As described above, semiconductor substrate 101 may include one or more active regions 101a that define p- and/or n-wells. Dotted lines "PN" and "NP" identify approximate locations of where a pair of p-wells and an n-well are formed in active area 101a of semiconductor substrate disposed vertically below the conductive layer illustrated in FIG. 3B.

Vias 152, 154, 156, and 158 connect the sources of transistors 118 and 124 to power supply line VSS, and vias 160 and 162 connect the sources of transistors 114 and 122 to power supply VDD. Via 136 connects the drain of pass transistor 126 to bit line A_BL, via 140 connects the drain of pass transistor 128 to bit line B_BL, and via 142 connects the drain of pass transistor 132 to bit line A_BLB.

Figure 3D:
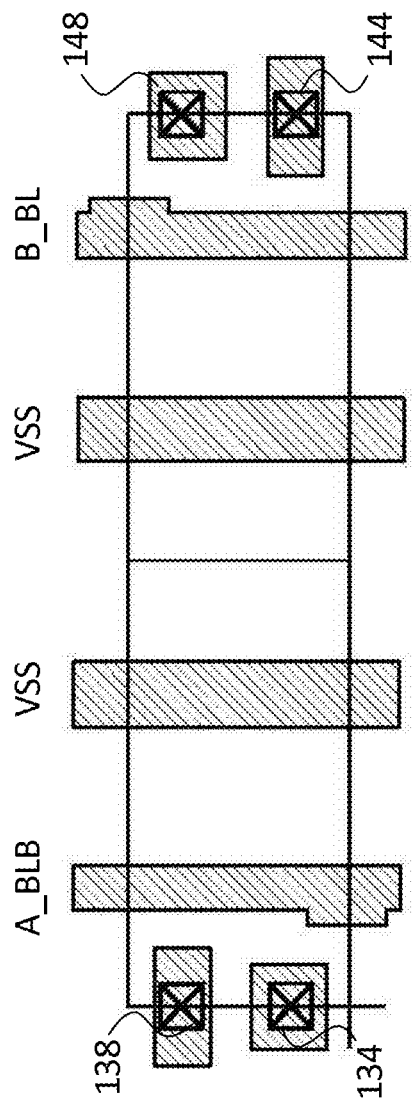
FIG. 3D illustrates one example of a layout of a third conductive layer of a semiconductor bit cell in accordance with FIG. 2.

One example of a layout in a second conductive layer, e.g., M2, is illustrated in FIG. 3C. As shown in FIG. 3C, vias 138 and 148 respectively couple the gates of transistors 128 and 132 to word line B_WL, and vias 134 and 144 respectively couple the gates of transistors 126 and 130 to word line A_WL. The second conductive layer also includes first and second lines for VSS as well as vias 152, 154, 156, and 158 that connect power supply lines VSS in the second conductive layer to power supply lines VSS in a third conductive layer (see FIG. 3D). Via 142 connects the drain of pass transistor 132, which is formed in the semiconductor substrate (not shown) below M1, to bit line A_BLB that extends in a y-direction in a third conductive layer as illustrated in FIG. 3D. Via 140 connects the drain of pass transistor 130, which is formed in the semiconductor substrate (not shown) below M1, to bit line B_BL that extends in the y-direction in the third conductive layer as illustrated in FIG. 3D.

Figure 3E:
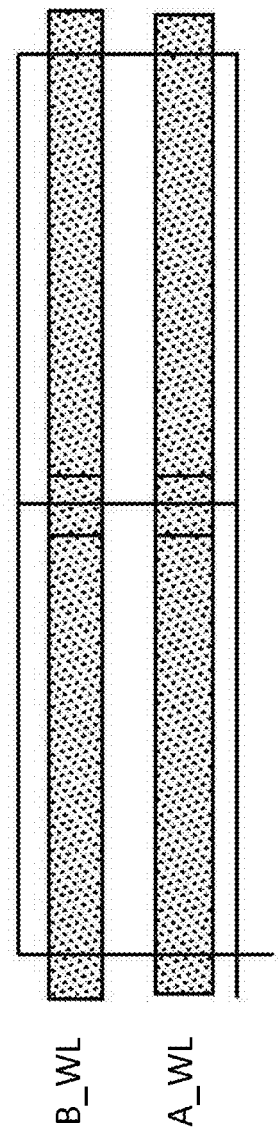
FIG. 3E illustrates one example of a layout of a fourth conductive layer of a semiconductor bit cell in accordance with FIG. 2.

FIG. 3D illustrates one example of a layout of a third conductive layer, i.e., M3, of bit cell 102. The third conductive layer includes vias 138 and 148 for respectively coupling the gates of transistors 128 and 132, which are formed in the semiconductor substrate (not shown), to word line B_WL that are formed in a fourth conductive layer as illustrated in FIG. 3E. Vias 134 and 144 respectively couple the gates of transistors 126 and 130, which are formed in the semiconductor substrate (not shown), to word line A_WL that extends in an x-direction as illustrated in FIG. 3E. The third conductive layer also includes bit lines A_BLB and B_BL, which are separated from one another by voltage supply lines for VSS. Each of bit lines A_BLB and B_BL and power supply lines for VSS extend parallel to one another in a y-direction.

FIG. 3E illustrates one example of a layout of a fourth conductive layer, e.g., M4, which may be disposed over the third conductive layer illustrated in FIG. 3D. As shown in FIG. 3E, the fourth conductive layer includes word lines A_WL and B_WL, which extend in an x-direction across the layout. Word lines A_WL and B_WL are respectively coupled to active devices in the semiconductor substrate (not shown) by vias 134, 144 and 138, 148 formed in each of the first through third conductive layers as described above. In some embodiments, the length ratio of the word lines to bit lines is between 3.5 to 5; however, one skilled in the art will understand that the length ratio of word lines to bit lines may be greater than or less than the disclosed range.

Although FIGS. 3B-3E are described as respectively corresponding to conductive layers M1-M4, one skilled in the art will understand that the layouts illustrated in FIGS. 3B-3E may be disposed on other metal layers. For example, the layout illustrated in FIG. 3E may be disposed on conductive layers M1, M2, M3, or another metal layer instead of on conductive layer M4. Similarly, for example, the layouts illustrated in FIGS. 3C and 3D may be disposed on other conductive layers, e.g., layers M1, M4, etc., instead of on metal layers M2 and M3.

FIGS. 4A and 4B illustrate another example of the layouts of conductive layers within regions that include a pair of bit cells (where underlying active device(s) in the region are not shown in FIGS. 4A and 4B). As described above, FIG. 4A may correspond to a second conductive layer, M2, and FIG. 4B may correspond to a third conductive layer, M3, although the layouts illustrated in FIGS. 4A and 4B may be disposed on other conductive layers. Referring first to FIG. 4A, the conductive layer includes vias 134, 144 and vias 138, 148 for respectively connecting the word lines A_WL and B_WL in another conductive layer, e.g., a fourth conductive layer (not shown) disposed above the illustrated conductive layer, to the active devices in the semiconductor substrate (not shown) disposed below the illustrated conductive layer. Via 146 is disposed between bit line A_BLB, which extends in the y-direction and the periphery of the cell layout along which vias 134 and 138 are disposed. As described above, via 146 couples bit line B_BLB, which may be disposed in the third conductive layer in this example (FIG. 4B), to the drain of transistor 132 formed in the semiconductor substrate (not shown).

A first voltage supply line for VSS is disposed adjacent to bit line A_BLB and to a voltage supply line for VDD. A second voltage supply line for VSS is disposed between the voltage supply line for VDD and bit line A_BL. The two voltage supply lines for VSS and the voltage supply line for VDD isolate bit lines A_BLB and A_BL from one another. Via 140 for connecting bit line B_BL, which is disposed in the third conductive layer in this example (FIG. 4B), to the drain of transistor 128 is disposed between bit line A_BL and the periphery of the cell layout along which vias 144 and 148 are disposed.

The conductive layer illustrated in FIG. 4B includes vias 134, 144 and vias 138, 148 for respectively connecting the word lines A_WL and B_WL in another, e.g., a fourth, conductive layer (not shown) disposed above (or below) the conductive layer to the active devices in the semiconductor substrate (not shown) disposed below the illustrated conductive layer. Bit lines B_BL and B_BLB extend in the y-direction and are separated from each other by a pair of power supply lines for VSS that extend parallel to bit lines B_BL and B_BLB. The pair of voltage supply lines for VSS in the conductive layer illustrated in FIG. 4B are coupled to the voltage supply lines for VSS disposed in the conductive layer illustrated in FIG. 4A by vias 152, 154, 156, and 158. The VSS supply lines are coupled by vias 152, 154, 156, and 158 to the sources of transistors 118 and 124 that are formed in the semiconductor substrate (not shown).

FIGS. 5A and 5B illustrate another embodiment of layouts of conductive layers that each include a pair of bit lines. The conductive layer illustrated in FIG. 5A includes vias 134, 144 for coupling word line A_WL disposed in another, e.g., a fourth, conductive layer (not shown) to active devices, e.g., to the gates of transistors 126 and 130, formed in the semiconductor substrate. Vias 138, 148 couple word line B_WL in another, e.g., a fourth, conductive layer (not shown) to the active devices, e.g., to the gates of transistors 128 and 132, formed in the semiconductor substrate. Via 142 is disposed between bit line B_BLB, which extends in the y-direction and the periphery of the cell layout along which vias 134 and 138 are disposed. Via 142 couples bit line A_BLB that is disposed in the conductive layer illustrated in FIG. 5B to the drain of transistor 130 formed in the semiconductor substrate.

Bit line B_BLB extends in the y-direction between via 142 and a first voltage supply line for VSS, which extends parallel to bit line B_BLB. A voltage supply line for VDD is disposed between the first voltage supply line for VSS and a second voltage supply line for VSS. Vias 152 and 156 are disposed along the first supply line for VSS and couple the first power supply line for VSS disposed in the conductive layer illustrated in FIG. 5A to a supply line for VSS disposed in the conductive layer illustrated in FIG. 5B. Vias 154 and 158 are disposed along the second supply line for VSS and couple the second power supply line for VSS disposed in the conductive layer illustrated in FIG. 5A to another supply line for VSS disposed in the conductive layer illustrated in FIG. 5B. Vias 152, 154, 156, and 158 also couple supply lines for VSS to the sources of transistors 118 and 124 that are formed in the semiconductor substrate (not shown).

The conductive layer illustrated in FIG. 5A also includes bit line A_BL, which is isolated from bit line B_BLB by power supply lines for VSS and VDD. Via 140 is disposed between bit line A_BL and vias 144 and 148. Via 140 couples bit line B_BL, which is disposed in the conductive layer illustrated in FIG. 5B, to the drain of transistor 128 formed in the semiconductor substrate.

The third conductive layer illustrated in FIG. 5B includes vias 134, 144 and vias 138, 148 for respectively connecting the word lines A_WL and B_WL in another, e.g., a fourth, conductive layer (not shown) to the active devices in the semiconductor substrate (not shown). Vias 134, 138, 144, and 148 are disposed around the periphery of the layout. Bit line A_BLB is disposed adjacent to vias 138 and 134 and a power supply line for VSS. A voltage supply line for VDD is disposed between the pair of voltage supply lines for VSS. Bit line B_BL is disposed adjacent to and extends parallel to one of the power supply lines for VSS and is separated from bit line A_BLB by the power supply lines for VSS and VDD.

FIGS. 6A and 6B illustrate another embodiment of layouts of conductive layers that each include a pair of bit lines. Referring first to FIG. 6A, the conductive layer includes vias 134 and 144 are configured to connect active devices formed in a semiconductor substrate (not shown), such as the gates of transistors 126 and 130, to word line A_WL that is formed in another, e.g., a fourth, conductive layer (not shown). Vias 138 and 148 are configured to couple active devices formed in a semiconductor substrate (not shown), such as the gates of transistors 128 and 132, to word line B_WL that is formed in another, e.g., a fourth, conductive layer (not shown).

Via 146 couples bit line B_BLB, which is disposed in the conductive layer illustrated in FIG. 6B, to the drain of transistor 130 formed in a semiconductor substrate (not shown). Via 146 is disposed between vias 134 and 138, which are disposed along a periphery of the bit cell layout, and bit line A_BLB that extends in the y-direction. Bit line A_BLB is separated from bit line A_BL by a power supply line for VDD and a pair of power supply lines for VSS that are disposed on either side of the power supply line for VDD.

Vias 152 and 156 are disposed along a first supply line for VSS, which is disposed between bit line A_BLB and the supply line for VDD, and vias 154 and 158 are disposed along a second supply line for VSS, which is disposed between the supply line for VDD and bit line A_BL. Vias 152, 154, 156, and 158 couple the supply lines for VSS to the sources of transistors 118 and 124 that are formed in the semiconductor substrate (not shown) and to supply lines for VSS that are disposed in the conductive layer illustrated in FIG. 6B. Via 140 is disposed between bit line A_BL and vias 144 and 148, which are disposed along a periphery of the layout of the bit cell. Via 140 is configured to couple an active device formed in the semiconductor substrate (not shown), such as transistor 128, to bit line B_BL, which is disposed in the conductive layer illustrated in FIG. 6B.

The conductive layer illustrated in FIG. 6B includes vias 134, 138, 144, and 148 disposed around the periphery of the bit cell layout. Vias 134 and 144 are vertically aligned with vias 134 and 144 in the conductive layer illustrated in FIG. 6A such that the devices formed in the semiconductor substrate (not shown), such as transistors 126 and 130, are coupled to word line A_WL formed in another, e.g., a fourth, conductive layer (not shown). Similarly, vias 138 and 148 are vertically aligned with vias 138 and 148 and are configured to couple active devices formed in a semiconductor substrate (not shown), such as transistors 128 and 132, to word line B_WL that is formed in another, e.g., a fourth, conductive layer (not shown).

Bit line B_BLB is disposed adjacent to vias 134 and 138 and vertically aligned with via 146 shown in FIG. 6A. Power supply lines for VSS and VDD are disposed adjacent to bit line B_BLB and are vertically aligned with the power supply lines for VSS and VDD disposed in the conductive layer illustrated in FIG. 6A. For example, a first power supply line for VSS in the conductive layer illustrated in FIG. 6B is vertically aligned with the first power supply line for VSS in the conductive layer illustrated in FIG. 6A such that the power supply lines for VSS in the different conductive layers are coupled together by vias 152 and 156. Similarly, a second power supply line for VSS in the conductive layer illustrated in FIG. 6B is vertically aligned with the second power supply line for VSS in the conductive layer illustrated in FIG. 6A such that the power supply lines for VSS in the conductive layers are coupled together by vias 154 and 158.

Bit line B_BL is disposed adjacent to the second power supply line for VSS and vias 144 and 148. Bit line B_BL is arranged on the layout of the bit cell such that bit line B_BL is coupled to via 140 in the conductive layer illustrated in FIG. 6A. The power supply lines for VSS and VDD are disposed between bit lines B_BLB and B_BL to shield the bit lines B_BLB and B BL from each other to reduce cross-talk.

Figure 7:
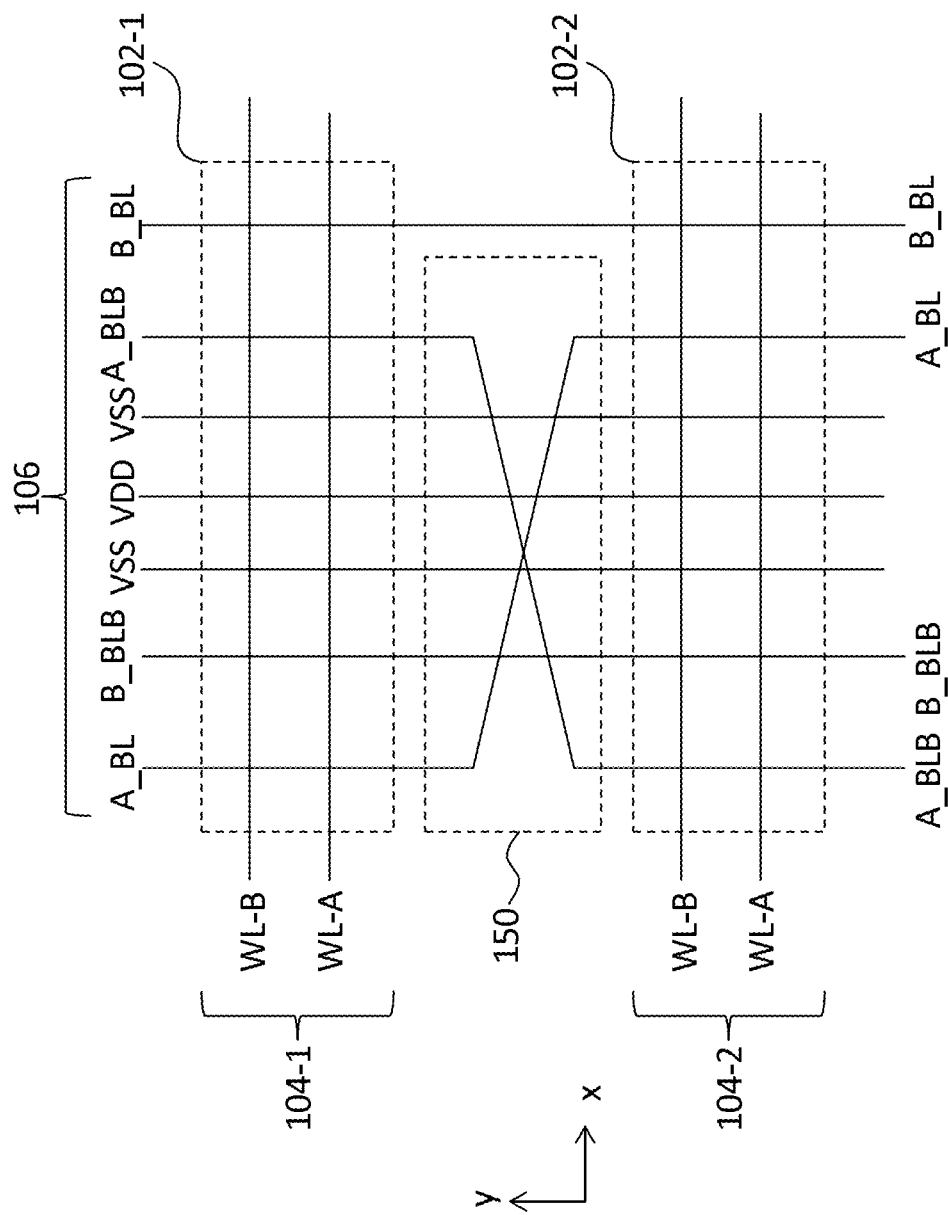
FIG. 7 illustrates an example of a pair of bit cells coupled together by twisting bit lines.

A single semiconductor memory device may include bit cells having different layouts. For example, a column of bit cells may include two or more different layout types to provide enhanced layout flexibility while reducing coupling capacitance and increasing packing density. FIG. 7 illustrates a pair of bit cells 102-1 and 102-2 disposed in a column 106. Bit cell 102-1 has a first layout, which may be implemented on a plurality of metal layers, in which bit lines A_BL and B_BLB are disposed directly adjacent to one another as are bit lines A_BLB and B_BL. Bit lines A_BL and B_BLB are separated from bit lines A_BLB and B_BL by power supply lines for VSS and VDD. Bit lines A_BL and B_BLB are disposed in different metal layers as are bit lines A_BLB and B_BL.

Bit cell 102-2 has a different layout than bit cell 102-2 and includes bit lines A_BLB and B_BLB disposed directly adjacent to one another. Bit lines A_BL and B_BL are disposed directly adjacent to one another and are separated from bit lines A_BLB and B_BLB by power supply lines for VSS and VDD. Bit lines A_BL and B_BL are disposed on different metal layers from one another, and bit lines A_BLB and B_BLB are disposed in different metal layer from one another.

In the example illustrated in FIG. 7, bit lines B_BLB and B_BL linearly extend from bit cell 102-1 to bit cell 102-2, are bit lines A_BL and A_BLB in bit cell 102-1 are not linearly aligned with bit lines A_BL and A_BLB of bit cell 102-2. A twist 150 is implemented between rows 104-1 and 140-2 that couples or routes bit line A_BL of bit cell 102-1 to the position in the x-direction of bit line A_BL of bit cell 102-2. Twist 150 also routes the bit line A_BLB of bit cell 102-1 such that it is aligned with and coupled to bit line A_BLB of bit cell 102-2. The twisting of the bit lines of a bit cell in one row to a bit cell in another row helps ease manufacturing constraints while enabling space savings as well as performance aspects of the bit cells.

The improved layouts of multi-port semiconductor bit cells disclosed herein advantageously reduce the footprint or cell size of the bit cells thereby enabling more bit cells to be implemented in a smaller area without suffering from coupling noise induced speed issues. For example, the cell structure may be reduced by 20 percent compared to conventional layouts. Additionally, the improved layouts may provide a 50 percent increase in operating speed due to less coupling noises.

In some embodiments, a semiconductor memory includes a first conductive layer including a first pair of bit lines coupled to a first bit cell and a second conductive layer including a second pair of bit lines coupled to the first bit cell. The first and second conductive layers are vertically separated from each other.

In some embodiments, a semiconductor memory includes a semiconductor memory comprising a latch, a first transistor coupled to the latch and to a first bit line, and a second transistor coupled to the latch and to a second bit line. A third transistor is coupled to the latch and to a third bit line, and a fourth transistor is coupled to the latch and to a fourth bit line. A first word line is coupled to a gate of the first transistor and to a gate of the second transistor, and a second word line is coupled to a gate of the third transistor and to a gate of the fourth transistor. The first and fourth bit lines are disposed in a first conductive layer, and the second and third bit lines are disposed in a second conductive layer separated from the first conductive layer.

In some embodiments, a semiconductor memory includes a plurality of bit cells arranged in a plurality of rows and columns. Each of the plurality of rows is associated with a respective pair of word lines, and each of the plurality of columns is associated with two respective pairs of differential bit lines. The first bit cell is disposed in a first row and a first column and includes a latch formed in a semiconductor substrate. First, second, third, and fourth transistors are formed in the semiconductor substrate and are coupled to the latch. A first bit line is disposed in a first conductive layer and is coupled to the first transistor by a first via. A second bit line is disposed in the conductive layer and is coupled to the second transistor by a second via. A third bit line is disposed in a second conductive layer and is coupled to the third transistor by a third via, a fourth bit line is disposed in the second conductive layer and is coupled to the fourth transistor by a fourth via.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A semiconductor memory, comprising:
    a first conductive layer including a first pair of bit lines coupled to a first bit cell; and
    a second conductive layer including a second pair of bit lines coupled to the first bit cell,
    wherein the first and second conductive layers are vertically separated from each other, and
    wherein the first conductive layer includes:
        first and second power supply lines configured to supply a first voltage disposed between the first pair of bit lines, and
        a third power supply line configured to supply a second voltage, the third power supply line disposed between the first and second power supply lines.

2. The semiconductor memory bit cell of claim 1, wherein each bit line of the first and second pairs of bit lines is coupled to a respective transistor of the first bit cell, the transistors formed in a semiconductor substrate over which the first and second conductive layers are disposed.

3. The semiconductor memory of claim 2, wherein each of the transistors has a respective gate coupled to one of a first and second word line formed in a third conductive layer.

4. The semiconductor memory bit cell of claim 2, wherein a pair of cross-coupled inverters forming a latch of the first bit cell to which the transistors are coupled are formed in the semiconductor substrate.

5. The semiconductor memory of claim 1, wherein the first and second conductive layers each include a respective power supply line disposed between and extending parallel to the pair of bit lines.

6. The semiconductor memory of claim 1, wherein the second conductive layer includes fourth and fifth power supply lines configured to supply the first voltage disposed between the second pair of bit lines.

7. A semiconductor memory, comprising:
  a first bit cell including:
    a latch,
    a first transistor coupled to the latch and to a first bit line,
    a second transistor coupled to the latch and to a second bit line,
    a third transistor coupled to the latch and to a third bit line,
    a fourth transistor coupled to the latch and to a fourth bit line,
    a first word line coupled to a gate of the first transistor and to a gate of the second transistor, and
    a second word line coupled to a gate of the third transistor and to a gate of the fourth transistor,
  wherein the first and fourth bit lines are disposed in a first conductive layer, and the second and third bit lines are disposed in a second conductive layer separated from the first conductive layer, and
  wherein the second conductive layer includes:
    first and second power supply lines configured to supply a first voltage and disposed between the second and third bit lines, and
    a third power supply line configured to supply a second voltage and disposed between the first and second power supply lines.

8. The semiconductor of claim 7, wherein the first and second word lines are disposed in a third conductive layer.

9. The semiconductor memory of claim 8, wherein vias extend from a semiconductor substrate in which the latch and first, second, third, and fourth transistors are formed to the third conductive layer through the first conductive layer.

10. The semiconductor memory of claim 9, wherein vias extend from the semiconductor substrate to the third conductive layer through the second conductive layer.

11. The semiconductor memory of claim 7, further comprising a second bit cell disposed in a same column as the first bit cell, wherein at least two of the first, second, third, and fourth bit lines are twisted between the first and second bit cells.

12. The semiconductor memory of claim 7, wherein the first conductive layer is disposed vertically over the second conductive layer.

13. The semiconductor memory of claim 7, wherein the second conductive layer is disposed vertically over the first conductive layer.

\* \* \* \* \*